US 6,677,204 B2

(12) United States Patent
Cleeves et al.

(10) Patent No.: US 6,677,204 B2
(45) Date of Patent: Jan. 13, 2004

(54) MULTIGATE SEMICONDUCTOR DEVICE WITH VERTICAL CHANNEL CURRENT AND METHOD OF FABRICATION

(75) Inventors: James M. Cleeves, Redwood City, CA (US); Vivek Subramanian, Redwood City, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 4 days.

(21) Appl. No.: 10/254,878

(22) Filed: Sep. 26, 2002

(65) Prior Publication Data

US 2003/0139011 A1 Jul. 24, 2003

Related U.S. Application Data

(62) Division of application No. 09/639,577, filed on Aug. 14, 2000.

(51) Int. Cl.[7] .............................................. H01L 21/336
(52) U.S. Cl. ....................... 438/268; 438/275; 438/270
(58) Field of Search ................. 438/156, 157, 438/161, 173, 176, 192, 195, 212, 268, 275, 276, 279, 283, 270

(56) References Cited

U.S. PATENT DOCUMENTS

| | | |
|---|---|---|
| 3,571,809 A | 3/1971 | Nelson |
| 3,573,757 A | 4/1971 | Adams |
| 3,576,549 A | 4/1971 | Hess |
| 3,582,908 A | 6/1971 | Koo |
| 3,629,863 A | 12/1971 | Neale |
| 3,634,929 A | 1/1972 | Yoshida et al. |
| 3,671,948 A | 6/1972 | Cassen et al. |
| 3,699,543 A | 10/1972 | Neale |

(List continued on next page.)

FOREIGN PATENT DOCUMENTS

| | | |
|---|---|---|
| DE | 197 26 085 | 12/1998 |
| EP | 0 783 181 | 7/1997 |
| JP | 6-338602 | 12/1994 |
| JP | 11-74382 | 3/1999 |

OTHER PUBLICATIONS

Frohman–Bentchkowsky, "A fully decoded 2048–bit Electrically Programmable FAMOS Read–Only Memory," IEEE Journal of Solid State Circuits, vol. SC–6, No. 5, Oct. 1971.

Sato et al., "A New programmable Cell Utilizing Insulator Breakdown," Fujitsu Limtied, Nakahar–ku, Kawaskai 211, Japan IEEE 1985.

Douglas, "The Route to 3–D Chips," High Technology, Sep. 1983, vol. 3, No. 9.

M. Arienzo et al.: "Diffusion of Arsenic in Bilayer Polycrystalline Silicon Films," J. Appl. Phys., Jan. 1984, pp. 365–369, vol. 55, No. 2, American Institute of Physics.

O. Bellezza et al.: "A New Self–Aligned Field Oxide Cell for Multimegabit Eproms," IEDM, pp. 579–582, IEEE.

S.D. Brotherton et al.: "Excimer–Laser–Annealed Poly–Si Thin–Film Transistors," IEEE Transactions on Electron Devices, FEb. 1993, pp. 407–413, vol. 40, No. 2, IEEE.

(List continued on next page.)

Primary Examiner—Amir Zarabian
Assistant Examiner—Jamie L. Brophy
(74) Attorney, Agent, or Firm—Foley & Lardner

(57) ABSTRACT

The present invention is a multibit nonvolatile memory and its method of fabrication. According to the present invention a silicon channel body having a first and second channel surface is formed. A charge storage medium is formed adjacent to the first channel surface and a second charge storage medium is formed adjacent to the second channel surface. A first control gate is formed adjacent to the first charge storage medium adjacent to the first channel surface and a second control gate is formed adjacent to the second charge storage medium adjacent to the second surface.

28 Claims, 10 Drawing Sheets

U.S. PATENT DOCUMENTS

| | | | |
|---|---|---|---|
| 3,717,852 | A | 2/1973 | Abbas et al. |
| 3,728,695 | A | 4/1973 | Froham-Bentchkowsky |
| 3,787,822 | A | 1/1974 | Rioult |
| 3,846,767 | A | 11/1974 | Cohen |
| 3,863,231 | A | 1/1975 | Taylor |
| 3,877,049 | A | 4/1975 | Buckley |
| 3,886,577 | A | 5/1975 | Buckley |
| 3,922,648 | A | 11/1975 | Buckley |
| 3,980,505 | A | 9/1976 | Buckley |
| 3,990,098 | A | 11/1976 | Mastrangelo |
| 4,146,902 | A | 3/1979 | Tanimoto et al. |
| 4,177,475 | A | 12/1979 | Holmberg |
| 4,203,123 | A | 5/1980 | Shanks |
| 4,203,158 | A | 5/1980 | Frohman-Bentchkowsky et al. |
| 4,272,880 | A | 6/1981 | Pashley |
| 4,281,397 | A | 7/1981 | Neal et al. |
| 4,419,741 | A | 12/1983 | Stewart et al. |
| 4,420,766 | A | 12/1983 | Kasten |
| 4,442,507 | A | 4/1984 | Roesner |
| 4,489,478 | A | 12/1984 | Sakurai |
| 4,494,135 | A | 1/1985 | Moussie |
| 4,498,226 | A | 2/1985 | Inoue et al. |
| 4,499,557 | A | 2/1985 | Holmberg et al. |
| 4,507,757 | A | 3/1985 | McElroy |
| 4,543,594 | A | 9/1985 | Mohsen et al. |
| 4,554,570 | A | 11/1985 | Jastrzebski et al. |
| 4,569,121 | A | 2/1986 | Lim et al. |
| 4,646,266 | A | 2/1987 | Ovshinsky et al. |
| 4,677,742 | A | 7/1987 | Johnson |
| 4,774,556 | A | 9/1988 | Fuji et al. |
| 4,811,114 | A | 3/1989 | Yamamoto et al. |
| 4,820,657 | A | 4/1989 | Hughes et al. |
| 4,823,181 | A | 4/1989 | Mohsen et al. |
| 4,876,220 | A | 10/1989 | Mohsen et al. |
| 4,881,114 | A | 11/1989 | Mohsen et al. |
| 4,899,205 | A | 2/1990 | Hamdy et al. |
| 4,922,319 | A | 5/1990 | Fukushima |
| 4,943,538 | A | 7/1990 | Mohsen et al. |
| 5,070,383 | A | 12/1991 | Sinar et al. |
| 5,070,384 | A | 12/1991 | McCollum et al. |
| 5,306,935 | A | 4/1994 | Esquivel et al. |
| 5,311,039 | A | 5/1994 | Kimura et al. |
| 5,334,880 | A | 8/1994 | Abadeer et al. |
| 5,391,518 | A | 2/1995 | Bhushan |
| 5,391,907 | A | 2/1995 | Jang |
| 5,426,321 | A | 6/1995 | Hydo |
| 5,427,979 | A | 6/1995 | Chang |
| 5,441,907 | A | 8/1995 | Sung et al. |
| 5,455,435 | A | 10/1995 | Fu et al. |
| 5,463,244 | A | 10/1995 | De Araujo et al. |
| 5,535,156 | A | 7/1996 | Levy et al. |
| 5,536,968 | A | 7/1996 | Crafts et al. |
| 5,675,547 | A | 10/1997 | Koga |
| 5,737,259 | A | 4/1998 | Chang |
| 5,745,407 | A | 4/1998 | Levy et al. |
| 5,751,012 | A | 5/1998 | Wolstenholme et al. |
| 5,776,810 | A | 7/1998 | Guterman et al. |
| 5,821,591 | A | 10/1998 | Krautschneider et al. |
| 5,830,575 | A | 11/1998 | Warren et al. |
| 5,835,396 | A | 11/1998 | Zhang |
| 5,883,409 | A | 3/1999 | Guterman et al. |
| 5,969,384 | A | * 10/1999 | Hong ......................... 257/322 |
| 5,973,352 | A | * 10/1999 | Noble ......................... 257/315 |
| 5,973,356 | A | 10/1999 | Noble et al. |
| 5,978,258 | A | 11/1999 | Manning |
| 6,033,957 | A | * 3/2000 | Burns et al. ................. 438/270 |
| 6,034,882 | A | 3/2000 | Johnson et al. |
| 6,049,106 | A | 4/2000 | Forbes |
| 6,157,061 | A | 12/2000 | Kawata |
| 6,294,418 | B1 | * 9/2001 | Noble ......................... 438/212 |
| 6,310,376 | B1 | 10/2001 | Ueda et al. |
| 6,313,487 | B1 | 11/2001 | Kencke et al. |

OTHER PUBLICATIONS

P. Candelier et al.: "Simplified 0.35–βm Flash EEPROM Process Using High–Temperature Oxide (HTO) Deposted by LPCVD as Interpoly Dielectrics and Peripheral Transistors Gate Oxide," IEEE Electron Device Letters, Jul. 1997, pp. 306–308, vol. 18, No. 7, IEEE.

Min Cao et al.: "A High–Performance Polysilicon Thin–Film Transistor Using XeCl Excimer Laser Crystallization of Pre–Patterned Amorphous Si Films," IEEE Transactions on Electron Devices, Apr. 1996, pp. 561–567, vol. 43, No. 4, IEEE.

Mino Cao et al.: "A Simple EEPROM Cell Using Twin Polysilicon Thin Film Transistors," IEEE Electron Device Letters, Aug. 1994, pp. 304–306, vol. 15, No. 8, IEEE.

Bomy Chen et al.: "Yield Improvement for a 3.5–ns BICMOS Technology in a 200–mm Manufacturing Line," IBM Technology Products, 1993, pp. 301–305, VLSITSA.

Victor W.C. Chan et al.: "Three Dimensional CMOS Integrated Circuits on Large Grain Polysilicon Films," IEDM, 2000, IEEE.

Boaz Eitan et al.: "Alternate Metal Virtual Ground (AMG)—A New Scaling Concept for Very High–Density EPROM's," IEEE Electron Device Letters, pp. 450–452, vol. 12, No. 8, Aug. 1991, IEEE.

Boaz Eitan et al.: "NROM: A Novel Localized Trapping, 2–Bit Nonvolatile Memory Cell," IEEE Electron Device Letters, pp. 543–545, vol. 21, No. 11, Nov. 2000, IEEE.

Boaz Eitan et al.: "Multilevel Flash cells and their Trade–offs," IEEE Electron Device Letters, pp. 169–172, 1996, IEEE.

Dr. Heinrich Endert: "Excimer Lasers as Tools for Material Processing in Manufacturing,"Technical Digest: International Electron Devices Meeting, 1985, pp. 28–29, Washington, DC, Dec. 1–4, 1985, Göttingen, Germany.

G.K. Giust et al.: "Laser–Processed Thin–Film Transistors Fabricated from Sputterd Amorphous–Silicon Films," IEEE Transactions on Electron Devices, pp. 207–213, vol. 47, No. 1, Jan. 2000, IEEE.

G.K. Giust et al.: "High–Performance Thin–Film Transistors Fabricated Using Excimer Laser Processing and Grain Engineering," IEEE Transactions on Electron Devices, pp. 925–932, vol. 45, No. 4, Apr. 1998, IEEE.

G.K. Giust et al.: "High–Performance Laser–Processed Polysilicon Thin–Film Transistors," IEE Electron Device Letters, pp. 77–79, vol. 20, No. 2, Feb. 1999, IEEE.

C. Hayzelden et al.: "Silicide Formation and Silicide–Mediated Crystallization of Nickel–Implanted Amorphous Silicon Thin Films," J. Appl. Phys. 73(12), Jun. 15, 1993, pp. 8279–8289, 1993 American Institute of Physics.

Stephen C.H. Ho et al.: "Thermal Stability of Nickel Silicides in Different Silicon Substrates," Department of Electrical and Electronic Engineering, pp. 105–108, 1998, IEEE.

Sung–Hoi Hur et al.: "A Poly–Si Thin–Film Transistor EEPROM Cell with a Folded Floating Gate," IEEE Transactions on Electron Devices, pp. 436–438, vol. 46, No. 2, Feb. 1999, IEEE.

J. Esquivel et al. "High Density Contactless, Self Aligned EPROM Cell Array Technology," Texas Instruments (Dallas), IEDM 86, pp. 592–595, 1986, IEEE.

R. Kazerounian et al.: Alternate Metal Virtual Ground EPROM Array Implemented in a 0.8βm Process for Very High Density Applications, IEDM 91, pp. 311–314, IEEE.

Chang–Dong Kim et al.: "Short–Channel Amorphous–Silicon Thin–Film Transistors," IEEE Transactions on Electron Devices, pp. 2172–2176, vol. 43, Dec. 1996, IEEE.

Johan H. Klootwijk et al.: "Deposited Inter–Polysilicon Dielectrics for Nonvolatile Memories," IEEE Transactions on Electron Devices, pp. 1435–1445, vol. 46, No. 7, Jul. 1999, IEEE.

NEC Corporation: "A Novel Cell Structure for Giga–bit EPROMs and Flash Memories Using Polysilicon Thin Film Transistors," 1992 Symposium on VLSI Technology Digest of Technical Papers, pp. 44–45, 1992, IEEE.

Ja–Hum Ku et al.: "High Performance pMOSFETs With Ni(Si/sub x/Ge/sub 1–x Si/Sub 0.8/Ge/sub 0.2/ gate, IEEE Xplore Citation," VLSI Technology, 200. Digest of Technical Paper Symposium on page(s): 114–115 Jun. 13–15, 2000.

Nae–In Lee et al.: "High–Performance EEPROM's Using N– and P–Channel Polysilicon Thin–Film Transistors with Electron Cyclotron Resonance N2O–Plasma Oxide," pp. 15–17, IEEE Electron Device Letters, vol. 20, No. 1, Jan. 1999, IEEE.

Jin–Woo Lee et al.: "Improved Stability of Polysilicon Thin–Film Transistors under Self–Heating and High Endurance EEPROM Cells for Systems–On–Panel," IEEE Electron Device Letters, 1998, pp. 265–268, IEEE.

Seok–Woon Lee et al.: "Pd induced lateral crystallization of Amorphous Si Thin Films," Appl. Phys. Lett. 66 (13), pp. 1671–1673, Mar. 27, 1995, American Institute of Physics.

K. Miyashita etal.: "Optimized Halo Structure for 80 nm Physical Gate CMOS Technology with Indium and Antimony Highly Angled Ion Implantation," IEDM 99–645, pp. 27.2.1–27.2.4, 1999, IEEE.

N.D. Young et al.: "The Fabrication and Characterization of EEPROM Arrays on Glass Using a Low–Temperature Poly–Si TFT Process," IEEE Transactions on Electron Devices, pp. 1930–1936, vol. 43, No. 11, Nov. 1996, IEEE.

Jung–Hoon Oh et al.: "A High–Endurance Low–Temperature Polysilicon Thin–Film Transistor EEPROM Cell," pp. 304–306, IEEE Electron Device Letters, vol. 21, No. 6, Jun. 2000, IEEE.

Webpage—M.C. Poon. et al.: "Thermal Stability of Cobalt and Nickel Silicides in Amorpho Crystalline Silicon," p. 1, IEEE Xplore, Electron Devices Meeting, 1997, Proceedings, 19 Hong Kong, 2000, IEEE.

Takeo Shiba et al.: "In Situ Phosphorus–Doped Polysilicon Emitter Technology for Very High–Speed Small Emitter Bipolar Transistors," IEEE Transactions on Electron Devices, pp. 889–897, vol. 43, No. 6, Jun. 1996, IEEE.

Seungheon Song et al.: "High Performance Transistors with State–of–the–Art CMOS Technologies," IEDM 99, pp. 427–430, 1999, IEEE.

Vivek Subramanian et al.: "Low–Leakage Germanium–Seeded Laterally–Crystallized Single–Grain 100–nm TFT's for Vertical Integration Applications," IEEE Electron Device Letters, pp. 341–343, vol. 20, No. 7, Jul. 1999, IEEE.

Yoshihiro Takao et al. "Low–Power and High–Stability SRAM Technology Using a Laser–Recrystallized p–Channel SOI MOSFET," IEEE Transactions on Electron Devices, pp. 2147–2152, vol. 39, No. 9, Sep. 1992, IEEE.

Kenji Taniguchi et al.: "Process Modeling and Simulation: Boundary Conditions for Point Defect–Based Impurity Diffusion Model," IEEE Transactions on Computer–Aided Design , pp. 1177–1183, vol. 9, No. 11, Nov. 1990, IEEE.

Hongmei Wang et al.: "Submicron Super TFTs for 3–D VLSI Applications," IEEE Electron Device Letters, pp. 391–393, vol. 21, No. 9, Sep. 2000, IEEE.

Hongmei Wang et al.: "Super Thin–Film Transistor with SOI CMOS Performance Formed by a Novel Grain Enhancement Method," IEEE Transactions on Electron Devices, pp. 1580–1586, vol. 47, No. 8, Aug. 2000, IEEE.

Marvin H. White et al. "On the Go With Sonos," Circuit & Devices, pp. 22–31, Jul. 2000, IEEE.

B.J. Woo et al.: "A Novel Memory Cell Using Flash Array Contactless Eprom (Face) Technology," IEDM, pp. 90–93, 1990, IEEE.

Webpage—Qi Xiang et al.: "Deep sub–100 nm CMOS with Ultra Low Gate Sheet Resista NiSi," VLSI Technology, 2000. Digest of Technical Paper Symposium on . . . pp. 76–77, IEEE Xplore, Jun. 13–15, 2000.

Qi Xiang et al."Deep Sub–100nm CMOS with Ultra Low Gate Sheet Resistance by NiSi," IEEE, pp. 76–77, 2000, Symposium on VLSI Technology Digest of Technical Papers.

Qiuxia Xu et al.: "New Ti–Salicide Process Using Sb and Ge Preamorphization for Sub–0.2 βm CMOS Technology," IEEE Transactions on Electron Devices, pp. 2002–2009, vol. 45, Sep. 1998, IEEE.

Kuniyoshi Yoshikawa et al.: "An Asymmetrical Lightly Doped Source Cell for Virtual Ground High–Density EPROM's," IEEE Transactions on Electron Devices, pp. 1046–1051, vol. 37, No. 4, Apr. 1990, IEEE.

John R. Lindsey et al.: "Polysilicon Thin Film Transistors and EEPROM Characteristics for Three Dimensional Memory," The 198th Meeting of The Electrochemical Society, Volum 2000–2.

Brian Dpiert: "Exotic Memories, Diverse Approaches," EDN Asia, Sep. 2001.

Dietmar Gogl et al.: "A 1–Kbit EEPROM in SIMOX Technology for High–Temperature Applications up to 250° C," IEEE Journal of Solid–State Circuits, Oct. 2000, vol. 35, No. 10, IEEE.

Plummer et al.., "A Self–Aligned Split–Gate Flash EEPROM Cell with 3–D Pillar Structure," Stanford University, Stanford, CA 1999 Symposium on VLSI Technology Digest of Technical Papers.

Subramanian, "Control of Nucleation and Grain Growth in Solid–Phase Crystallized Silicon for Hight–Performance Thin Film Transistors," Stanford University, Stanford, CA, Jun. 1998.

* cited by examiner

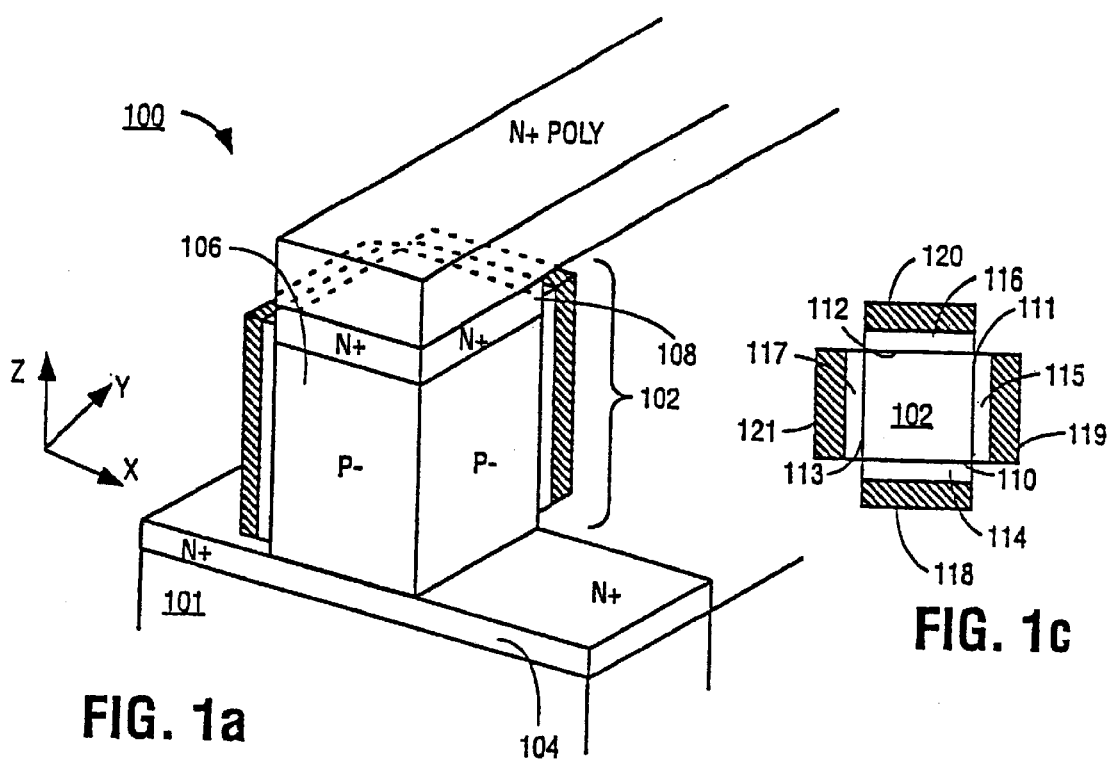
FIG. 1a
FIG. 1c
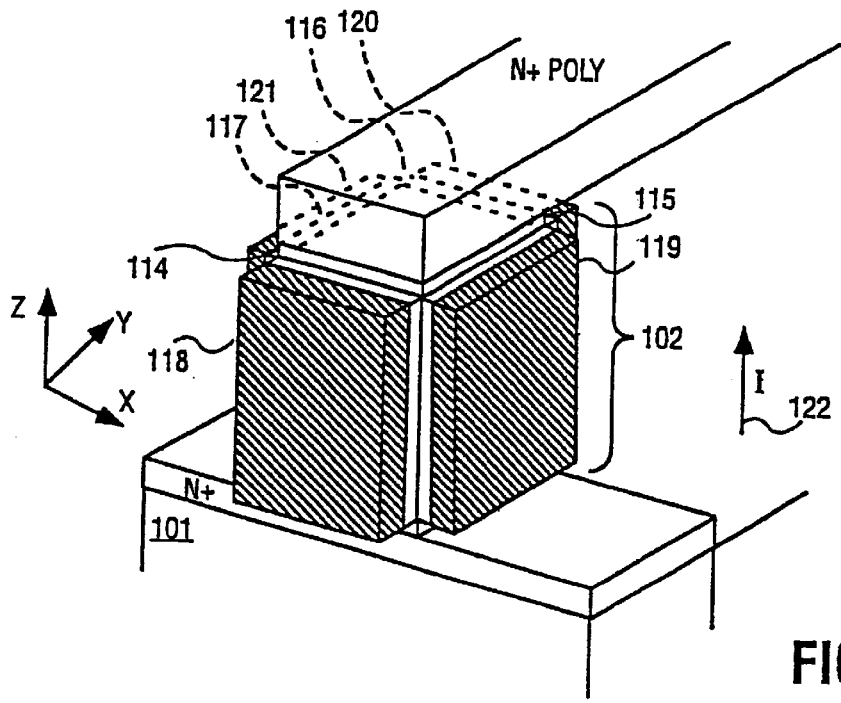
FIG. 1b

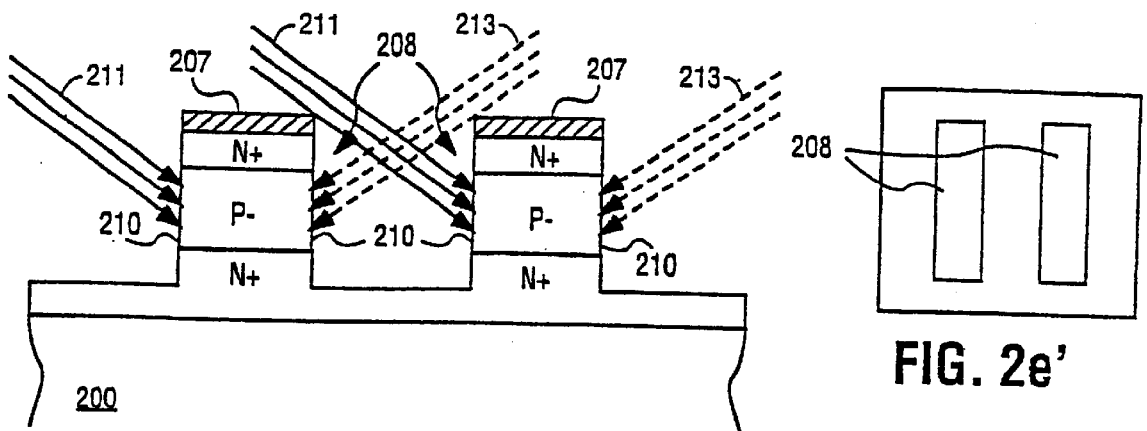
FIG. 2e
FIG. 2e'
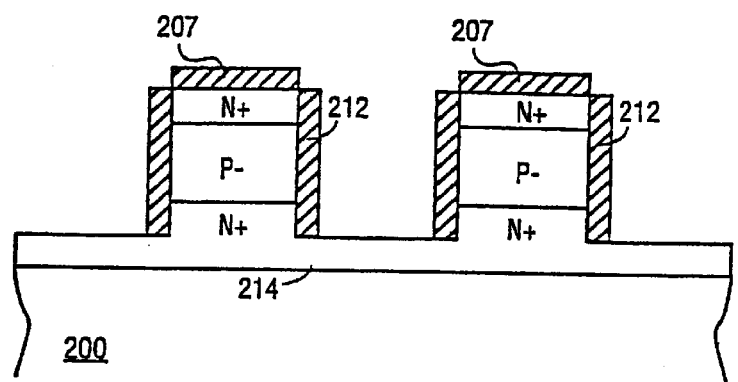
FIG. 2f
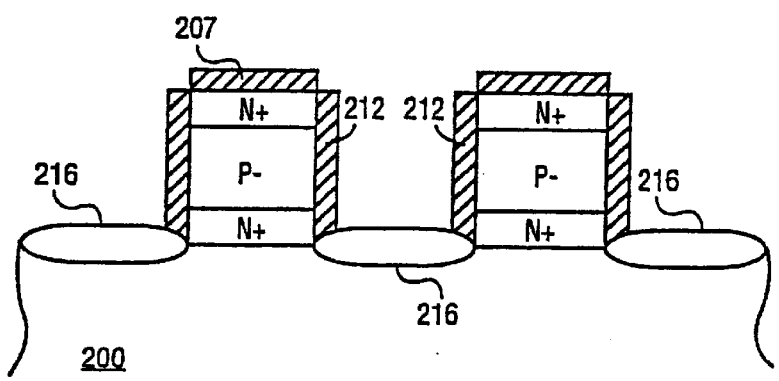
FIG. 2g

MULTIGATE SEMICONDUCTOR DEVICE WITH VERTICAL CHANNEL CURRENT AND METHOD OF FABRICATION

BACKGROUND OF THE INVENTION

1. Field of the Invention

The present invention relates to the field of nonvolatile memories and more specifically to a multibit nonvolatile memory and its method of fabrication.

2. Discussion of Related Art

As integrated circuits and computers have become powerful, new applications have arisen that require the ability to store large amounts of data. Certain applications require a memory with the ability to write and erase data and the ability to store data in a nonvolatile manner. Presently, such memories are formed with electrically erasable nonvolatile memories such as flash devices and EEPROMS. Unfortunately, these devices that are formed in the same plane and therefore require input/outputs (I/Os) which also run in the same plane. Having a source and drain input/output conductors running in the same plane, significantly reduces the number of devices that can be fabricated in a single plane and thereby significantly reduces the storage capability of the memory.

What is desired is a nonvolatile memory device which can be easily fabricated in a dense array, so that large amounts of data can be stored in a nonvolatile manner.

SUMMARY OF THE INVENTION

According to a first aspect of the present invention a silicon channel body having a first and second channel surface is formed. A charge storage medium is formed adjacent to the first channel surface and a second charge storage medium is formed adjacent to the second channel surface. A first control gate is formed adjacent to the first charge storage medium adjacent to the first channel surface and a second control gate is formed adjacent to the second charge storage medium adjacent to the second surface.

According to a second aspect of the present invention, a transistor is provided that has a source, a channel, a drain, and a plurality of gates where the channel current flows vertically between the source and drain.

According to a third embodiment of the present invention, a memory element is formed using a transistor that has a read current that flows in a direction perpendicular to a substrate in or over which the transistor is formed. The transistor has a charge storage medium for storing its state. Multiple control gates address the transistor.

BRIEF DESCRIPTION OF THE DRAWINGS

FIGS. 1*a* and 1*b* are illustrations of isometric views of a pillar memory or transistor having multiple gates in accordance with the present invention.

FIG. 1*c* is an illustration of an overhead view of the pillar memory or transistor shown in FIGS. 1*a* and 1*b*.

DETAILED DESCRIPTION OF THE PRESENT INVENTION

Figure 1D:
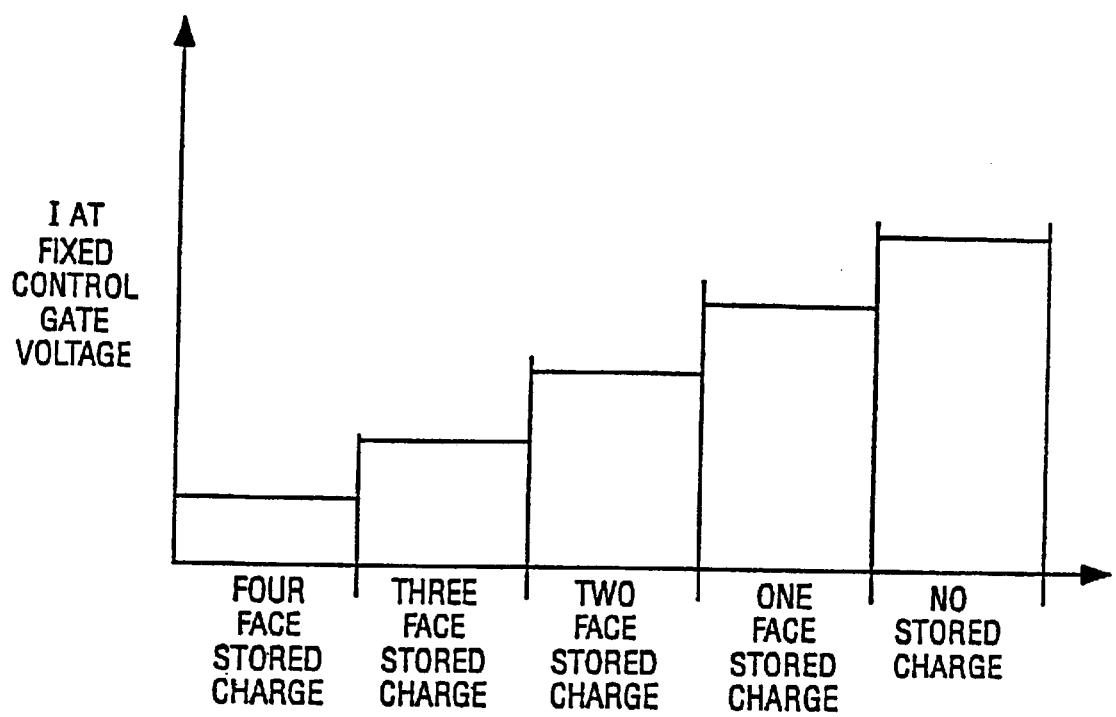
FIG. 1*d* is a graph which illustrates the ability to simultaneously store and read multiple bits of information from a single pillar memory in accordance with the present invention.

The present invention is a novel multigate semiconductor device having vertical channel current and its method of fabrication. In the following description numerous specific details are set forth in order to provide a thorough understanding of the present invention. One of ordinary skill in the art will appreciate that these specific details are not necessary to practice the present invention. In other instances, well-known semiconductor memory layout and processing techniques have not been described in specific detail in order to not unnecessarily obscure the present invention.

The present invention is a novel multigate semiconductor device and its method of fabrication. The multigate semiconductor device can be used as a multibit nonvolatile memory or as a multiple gate transistor. The present invention will be described with respect to a multibit nonvolatile memory. A multibit nonvolatile memory 100 in accordance with the present invention is illustrated in FIGS. 1*a*–1*c*. Nonvolatile memory device 100 includes a pillar 102. Pillar 102 comprises a stack of film providing a first source/drain region 104, a channel or body region 106, and a second source/drain region 108 formed on the channel region. In one embodiment of the present invention, the pillar includes a first source/drain region 104 formed from a heavily doped N+ single crystal silicon film having a doping density in the range between $1 \times 10^{19}$ to $1 \times 10^{20}$ atoms/cm$^3$, a body 106 formed from a P type single crystal silicon film having a doping density between $1 \times 10^{16}$ to $1 \times 10^{18}$ atoms/cm$^3$ and a second source/drain region 108 formed from a heavily doped N+ single crystal silicon film having a doping density between $1 \times 10^{19}$ to $1 \times 10^{20}$ atoms/cm$^3$.

The N+ source/drain regions 104 and 108 can have thickness between 500–1000 Å. The thickness of the P type silicon body defines the channel length of the device (i.e., the distance between the source and drain region). The thickness of the P type body 106 can be between 1000–7000 Å and is dependent upon the programming voltages desired for the device. For low programming voltages (e.g., 4–5 volts) the P type silicon film 106 can have a thickness between 1000–2500 Å while for higher programming voltages (e.g., 6–10 volts) a P type silicon film having a thickness between 6000–7000 Å can be used.

In an embodiment of the present invention the pillar 102 is formed so the first source/drain region 104, the body 106, and the second source/drain region 108 are each vertically aligned over one another as shown in FIG. 1*a*. The pillar 102 is formed in a rectangular or square pattern so that the pillar has four separate faces or sides 110, 111, 112, and 113 as shown in FIG. 1*c*. Pillar 102 has two faces 110 and 112 which are along laterally opposite sides and two other faces 111 and 113 which are formed along laterally opposite sides.

In memory device 100 adjacent to each face 110–113 is a charge storage medium 114, 115, 116, and 117 as shown in FIG. 1*c*. In one embodiment of the present invention, the charge storage mediums 114–117 are formed from a deposited oxide having H+ ions contained therein. A H+ containing oxide acts as a charge trapping dielectric enabling it to store charge therein. In another embodiment of the present invention, the charge storage mediums 114–117 are a silicon oxide-silicon nitride-silicon oxide (i.e., ONO) dielectric stack. In another embodiment of the present invention, the charge storage mediums 114–117 can be nanocrystals isolated by a tunnel dielectric from pillar 102 and isolated from a control gate by a control gate dielectric. In yet another embodiment of the present invention, the charge storage medium is a continuous conductive film floating gate such as polysilicon isolated by a tunnel dielectric from pillar 102 and isolated from a control gate by a control gate dielectric.

Adjacent to and in direct contact with each charge storage medium 114–117 is a separate independently controllable control gate 118, 119, 120, and 121 as shown in FIG. 1c. Because the memory 100 of the present invention contains separately controllable control gates, each charge storage medium adjacent to each face 110–113 can be independently and separately programmed (written into) or unprogrammed (erased). The control gates and charge storage medium are constructed so that they lie laterally adjacent to the pillar 102 so that they may electrically communicate with pillar 102. The charge storage medium is the region that electrically screens the control gate and the channel region addressed by the control gate.

The programmed or unprogrammed state of each face of the pillar memory is determined by whether or not charge is stored in the respective charge storage medium 114–117. The charge stored in the charge storage medium adds or subtracts from the voltage applied to the control gate thereby altering the voltage required to form a conducting channel in silicon channel 106 to enable a current (e.g., a read current) to flow between the first and second source/drain regions 104 and 108. The voltage required to form a conducting channel is defined as the threshold voltage $V_T$. The amount of voltage required to form a conducting channel for a given amount of current in each face of body 106 can be used to determine whether or not the face is programmed or unprogrammed. Alternatively, the amount of current (read current) generated for a given control gate voltage can be used to determine whether or not the face is programmed or unprogrammed. During read operations of device 100, when a conductive channel is formed in body 106, current 122 flows vertically (or perpendicular) (z) with respect to the plane (x-y) of the substrate 101 on which the pillar memory device is formed.

The state of pillar memory device 100 can be read or determined in a number of different ways that can enable multiple states and therefore multiple bits to be stored in a single pillar memory 100. In one embodiment, each face or surface of pillar memory 100 is read sequentially or independently. In such a scheme, a positive voltage (e.g. 3 volts) can be applied to the drain region while a given positive gate voltage (e.g. 4–5 volts) is sequentially or independently applied to each control gate. If a current is sensed at the source for a given control gate voltage then it is indication that no charge is stored in the associated charge storage medium. (It is to be appreciated that in an NMOS device (i.e. N+/P–/N+ pillar) that when electrons are stored in a charge storage medium, the electrons subtract from the positive voltage placed on the control gate thereby inhibiting the formation of a conductive channel in the respective face.) Each control gate can be separately probed to determine whether or not charged is stored in each associated charge storage medium. In this way, each face of pillar memory 100 can store a separate bit of information for a total of 4 bits during a sequential read.

In another scheme utilizing a sequential or independent read, different amounts of charge can be stored in each charge storage medium. That is, in an embodiment of the present invention different amounts of charge (e.g. charge amount 1, charge amount 2, charge amount 3 wherein charge amount 3>charge amount 2>charge amount 1) can be stored in each charge storage medium. Each face can then be sequentially or independently read as discussed above. The amount of stored charge will determine the amount of current that flows through each face for a given amount of control gate voltage. If for example, a charge storage medium storing charge amount 3 would result in no current flowing through the face, when charge amount 2 is stored in the charge storage medium a first amount of current would flow through the face, and when charge amount 1 is stored a larger current would flow and when no charge is stored the largest of current would flow. In this way, each face of pillar memory 100 can have four states and thereby store 2 bits of information enabling a single pillar memory 100 to store 8 bits of information during a sequential or independent read scheme.

In another read scheme in accordance with the present invention, the pillar memory 100 can be read in a parallel fashion whereby a positive voltage of for example, 3 volts, is applied to the drain while a given positive voltage (e.g. 4–5 volts) is applied simultaneously to each control gate and the amount of read current that flows into the source region is sensed. In the parallel read scheme when a given voltage is applied to each control gate simultaneously, the current that flows into the source is the summation of the currents flowing through each face of body 106. For example, as shown in FIG. 1d, when no face contains store charge the totally or summation current is the largest. When only one face stores charge the summation current is the next largest and so on. In this way, a single pillar memory has five identifiable states enabling up to 2½ bits to be stored and read simultaneously in a single pillar memory 100. It is to be appreciated that parallel read and write operations can be significantly faster than sequential read and write operations.

In yet another embodiment of the present invention, each face or surface 110–113 of a P type body 106 has a different doping density thereby creating different threshold voltages in each face 110–113. The different doping densities can be formed utilizing threshold adjusting implants. The doping densities are chosen so that each face creates a distinct and identifiable amount of read current for a given voltage. For example, one face can have a threshold voltage so that either no current flows or a current $I_1$ flows through the face; a second face can have a threshold voltage so that either no current flows or a current $I_2$ flows wherein $I_2=2\times I_1$; a third face can have a third threshold voltage so that either no current flows or a current $I_3$ flows where $I_3=3\times I_1$, and a fourth face can have a fourth threshold voltage so that either no current flows or a current $I_4$ flows wherein $I_4=4\times I_1$. In this way, when a given voltage is applied to all control gates simultaneously, one of 16 different summation currents will result (i.e. 0, $1\times I_1$, $2\times I_1$, $3\times I_1$, . . . ) will occur thereby indicating one of 16 states and enabling up to 4 bits of information to be simultaneously stored and read in pillar memory 100.

Still further, it is conceivable that one can utilize different threshold voltages in each pillar face as well as store different amounts of charge in each charge storage medium to thereby provide more states in pillar memory 100 and enable the storing of simultaneous read and write of even more bits in a single pillar memory.

It is to be appreciated that although the memory device 100 as shown in FIGS. 1a–1c has four independently controllable control gates, it is possible to form a pillar memory which only has two or three independently controllable control gates. For example, control gates around a single rectangular pillar can be coupled together to form two or three independently controlled control gates. Additionally, it is conceivable to form a pillar memory having more than four faces to enable more states to be stored in a single pillar. For example, one can form a pillar having a triangle, pentagon, hexagon, or octagon shape to provide additional faces.

In order to store charge in one of the charge storage mediums 114–117, electrons can be placed in the charge storage mediums 114–117 utilizing drain side programming by grounding the source region while a relatively high voltage is applied to the drain region and while approximately 4–5 volts for low voltage operations or 6–10 volts for high voltage operations is applied to the respective control gate in order to invert a portion of the P type silicon body 106 into N type silicon so that a channel region is formed and the electrons flow between the source region and the drain region. The high control gate voltage pulls electrons from the inverted channel region and into the charge storage medium. It is to be appreciated that other programming techniques such as source side injection can be used to store charge in-charge storage mediums 114–117.

The charge storage mediums 114–117 can be erased by placing a relatively high positive voltage (3 volts) on the source region while applying a negative voltage of approximately 4–5 volts for low voltage operations and a negative voltage of 6–10 volts for high voltages operations onto the respective control gate. The positive voltage on the source region attracts electrons trapped in the charge storage medium and thereby pulls the electrons from the charge storage medium and into the source region.

It is to be appreciated that memory device 100 as shown in FIGS. 1a–1c can be made of opposite polarity by simply reversing the conductivity type of each of the silicon regions in the pillar and maintaining concentration ranges. In this way, not only can NMOS devices be fabricated as shown in FIG. 1a, but also PMOS devices can be formed if desired.

Although the multigate memory device 100 of the present invention has been illustrated in FIGS. 1a–1c utilizing a N+/P−/N+ single crystal silicon structure, it is to be appreciated that other pillar compositions can be used. For example, a gated diode memory device having multiple control gates can be formed from a pillar comprising a P+/P−/N+ single crystalline structure. The P+ and N+ regions provide contacts to the P–silicon body or channel and can have a thickness between 500–1000 Å and doping density between $1 \times 10^{19}$ to $1 \times 10^{20}$ atoms/cm$^3$. Such a single crystalline silicon structure can be formed by forming the P+ type silicon region in a single crystalline substrate and then growing a P− single crystalline silicon film on the P+ type silicon region and then forming a N+ single crystalline silicon region on the P− single crystalline silicon region by for example ion implanting N type dopants into the P− single crystalline silicon and counter doping it to N+. Additionally, the silicon film used to form pillars may be silicon alloy films such as silicon germanium doped with N type or P type conductivity ions to the desired concentration.

Figure 2A:
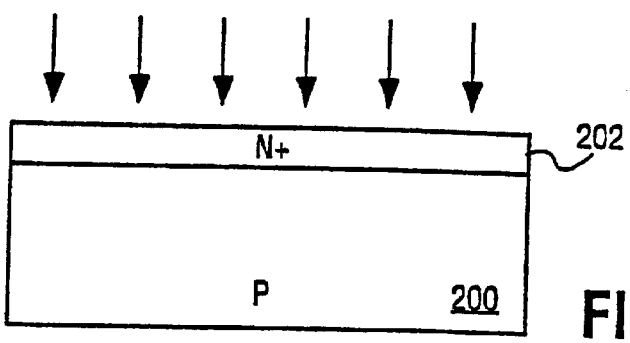
FIGS. 2*a*–2*r* illustrates a method of fabricating a multigate transistor or, memory having a vertical read current in accordance with the present invention.

A method of fabricating a multibit nonvolatile pillar memory 100 as shown in FIG. 1a will now be described. According to the present invention a starting substrate 200 is provided. In an embodiment of the present invention as shown in FIG. 2a starting substrate 200 is a P type monocrystalline silicon substrate having a doping density of between $1 \times 10^{15}$ to $1 \times 10^{17}$ atoms/cm$^3$. A heavily doped N+ region 202 having a doping density between $1 \times 10^{19}$ to $1 \times 10^{20}$ atoms/cm$^3$ is then formed in the top surface of the P type silicon substrate as shown in FIG. 2a. A heavily doped N+ region can be formed by ion-implanting or diffusing arsenic or phosphorous atoms into the P type monocrystalline silicon substrate and counter doping it to N type single crystal silicon.

Figure 2B:
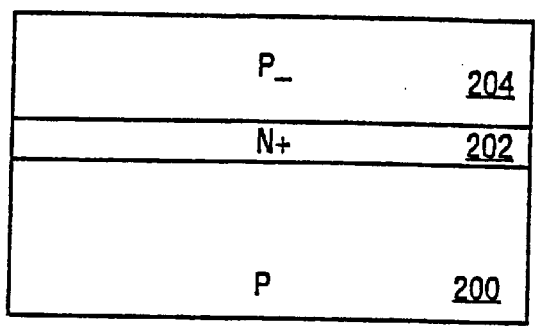

Next, as shown in FIG. 2b, a P type single crystal silicon film 204 having a doping density between $1 \times 10^{16}$ to $1 \times 10^{18}$ atoms/cm$^3$ is then grown on the heavily doped N+ region 202. A P type single crystal silicon film can be formed by chemical vapor deposition utilizing a process gas mix comprising a silicon source gas, such as but not limited to silane (SiH$_4$), and a P type dopant source to insitu dope the single crystal silicon film 204 with P type impurities (e.g., boron). Alternatively, an undoped single crystal silicon film can be deposited and doped by diffusion or ion implantation. The P type single crystal silicon film 204 is formed to at least a thickness desired for the channel length of the device which can be between 1000–7000 Å depending upon the program voltage desired.

Figure 2C:
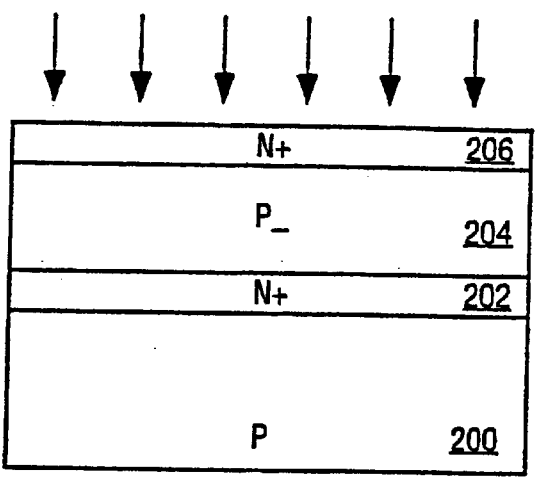

Next, as shown in FIG. 2c, the top surface of the P type crystalline silicon film is doped with N type impurities to form a N+ region 206 having a doping density between $1 \times 10^{19}$ to $1 \times 10^{20}$ atoms/cm$^3$. The thickness of the N+ doped region can be between 500–1000 Å. In an alternative to using ion-implantation or diffusion to form N+ region 206, an N+ crystalline film can be grown directly onto the P type silicon film 204. If ion-implantation or diffusion is used to form region 206, then the thickness of the P type silicon film 204 is deposited to a thickness required for the channel of the device and also for the N+ region 206.

Figure 2D:
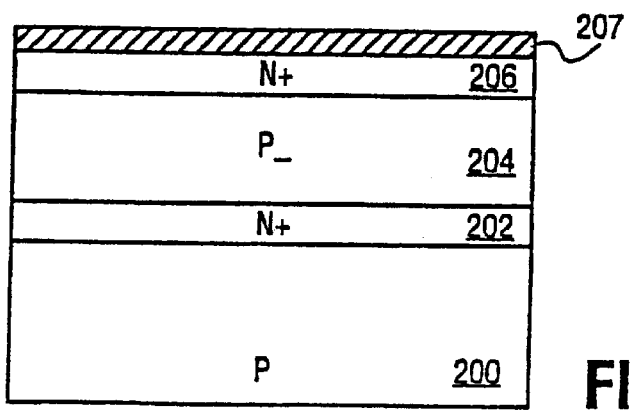

Next, an oxidation resistant film 207, such as a silicon nitride film, is blanket deposited onto N+ region 206 as shown in FIG. 2d. The oxidation resistant film may be used in combination with an interlayer film such as silicon dioxide to enable easier subsequent removal of the same. Next, as shown in FIG. 2e, the nitride layer 207, the N+ region 206, the P type region 204, and a portion or all of the N+ region 202 are patterned into a plurality of parallel strips or lines 208. FIG. 2e is a side view showing formed strips or lines 208. Well-known photolithography and anisotropic etching techniques can used to form the nitride/N+/P−/N+ strips 208 having substantially vertical sidewalls 210.

Next, as also shown in FIG. 2e, if desired the substrate can be subjected to threshold adjusting ion implantation steps in order to alter the doping density of each surface or face of the P type silicon region 204 of each strip 208. That is, at this time, a first ion implantation step 211 can be used to implant one surface of strips 208 with P type dopants to increase its P type doping density or can be implanted with N type dopants to counter dope and decrease its P type doping density. Similarly, after the first implant 211 the substrate can be rotated and subjected to a second ion implantation step 213 to alter the doping density of the opposite side or face of strips 208. The threshold adjustment implants should be of sufficient dose to sufficiently alter the threshold voltage of each face so as to be able to distinguish different read currents associated with each face. The angle of the ion implantation step is chosen so that the bulk of the implantation occurs into the surface of the sidewall 210 of the P type body 204. The angle of the implant is dependent upon the strip height as well as on the spacing between strips 208.

Next, as shown in FIG. 2f, an oxidation resistant film 212, such as silicon nitride, is formed along the sidewalls 210 of lines 208. A silicon nitride film 212 can be formed along the sidewalls 210 utilizing a "spacer" technique whereby a conformal silicon nitride film is first blanket deposited, by for example, plasma enhanced chemical vapor deposition (PECVD) over and around strips 208. The blanket deposited film is then anisotropically etched back so that it is removed from horizontal surfaces such as the remaining N+ film 214 located between strips 208. The etch back will also remove the film from the top of strips 208; however, the previously deposited silicon nitride film 207 on the top of the strips will remain.

Next, as shown in FIG. 2g, the substrate is oxidized to form silicon oxide isolation regions 216. Silicon oxide isolation regions 216 can be formed by heating the substrate to a temperature between 900–1050° C. and exposing the substrate to an oxidizing environment such as $O_2$ or $H_2O$. Silicon oxide 216 forms only on regions where silicon is exposed and available to react such as N+ regions 214 located between strips 208. No oxides form on the top or sides of the silicon strips 208 because the nitride films 207 and 212 protect the top and sidewalls of the strips and prevent the silicon from oxidizing. A silicon oxide isolation region can have thickness between 200–500 Å. Although a LOCOS isolation process is described, other isolation techniques such as oxygen implant or modified versions of trench isolation can be used.

Figure 2H:
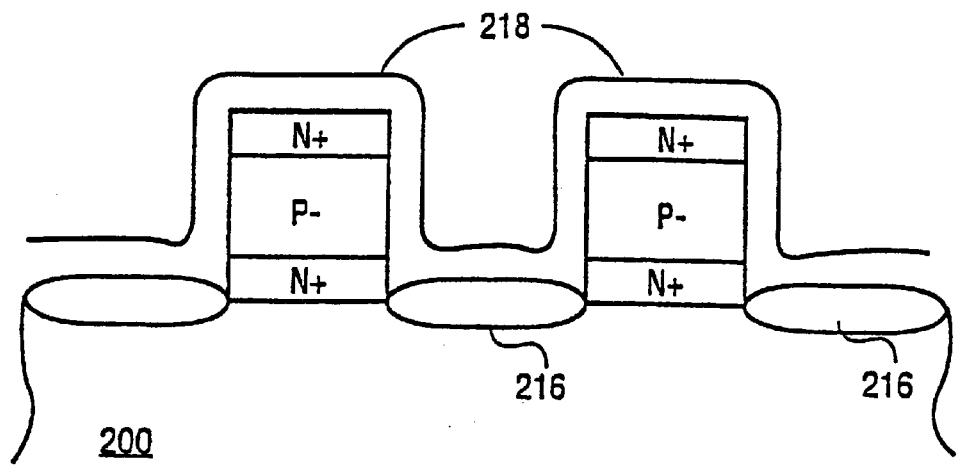

Next, as shown in FIG. 2h, the nitride films 207 and 212 are removed or stripped by well-known techniques from lines 208. Next, as also shown in FIG. 2h, a charge storage medium 218 is blanket deposited over and around strips 208 and onto oxide isolation regions 216 between strips 208. In an embodiment of the present invention the charge storage medium is a charge trapping dielectric. In one embodiment of the present invention, the charge trapping dielectric is an oxide film containing H+ ions. An H+oxide film having a thickness between 100–400 Å can be used. A H+ oxide film can be formed by depositing silicon oxide film and then forming strains in the film by for example ion implantation of silicon or a high temperature anneal. The oxide film is then annealed at about 600° in a hydrogen ambient to incorporate hydrogen ions into the silicon oxide film at the strains. An example of a method of forming a H+ oxide film is described in U.S. Pat. No. 5,830,575.

In another embodiment of the present invention, the charge trapping dielectric is a silicon oxide-silicone nitride-silicon oxide composite film stack also known as an ONO film stack. In another embodiment of the present invention, the charge storage medium comprises a floating gate formed from a noncontinuous conductive nanocrystals which are isolated from strips 208 by a tunnel dielectric and from a subsequently formed control gate by a control gate dielectric.

Silicon nanocrystals can be formed by depositing silicon in a manner whereby silicon has a very high surface difusitivity relative to its sticking co-efficient. For example, silicon nanocrystals can be formed by chemical vapor deposition (CVD), by decomposing silane ($SiH_4$) at a very low pressure, between 1 millitorr to 200 millitorr, at a temperature between 250–650° C. In such a process, a very thin deposition, between 5–50 Å, will form little islands of silicon. If $H_2$ is included with silane during the deposition, higher pressures can be utilized and still obtain nanocrystals. In an alternative embodiment of the present invention, metal nanocrystals, such as aluminum nanocrystals, can be formed by sputtering from a metal target at a temperature near the melting temperature of the metal, so that the metal agglomerates and forms nanocrystals. Tungsten nanocrystals can be formed by chemical vapor deposition utilizing a reactant gas mix comprising a tungsten source gas such as $WF_6$ and germane ($GeH_4$). In still yet another embodiment of the present invention, a continuous film of floating gate material can be deposited and then caused to precipitate (by heating) to cause islands to form in the film.

It is to be appreciated that although nanocrystals are preferred for the floating gate, because of their self isolating quality, the floating gate can be formed from a continuous film such as, but not limited to, a metal such as tungsten or a silicon film such as polycrystalline or amorphous silicon doped to the desired conductivity type (typically N+ silicon for a N+/P–/N+ pillar). If a continuous film is used as floating gate material the film would be anisotropically etched at this time to remove the portion of the floating gate material between strips to electrically isolate the strips.

Figure 2I:
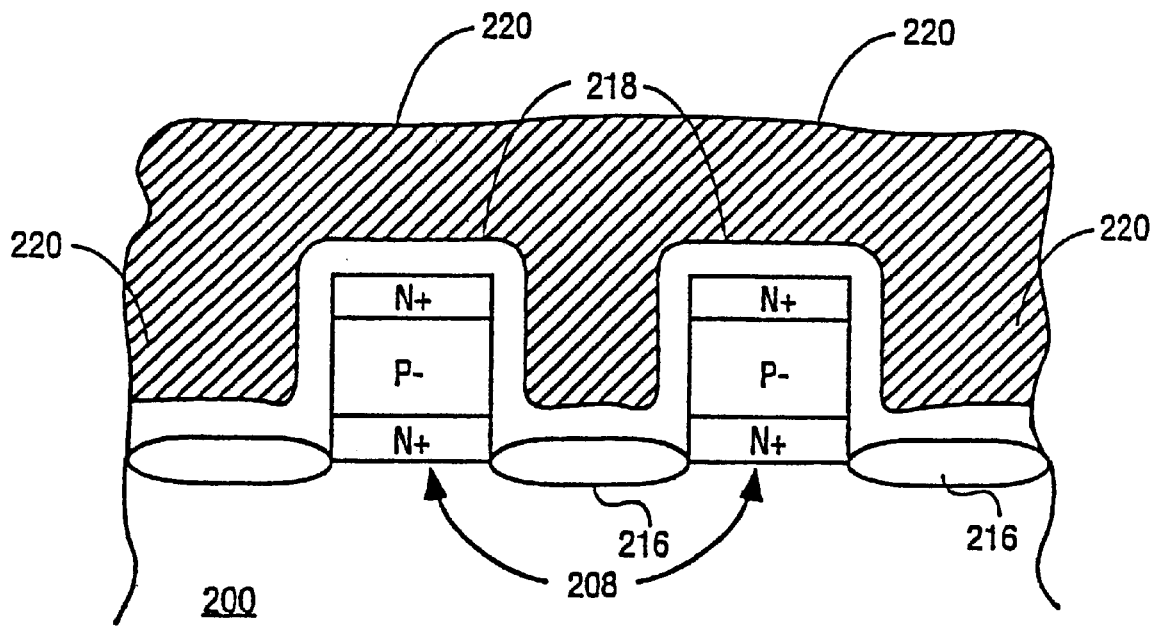
Figure 2J:
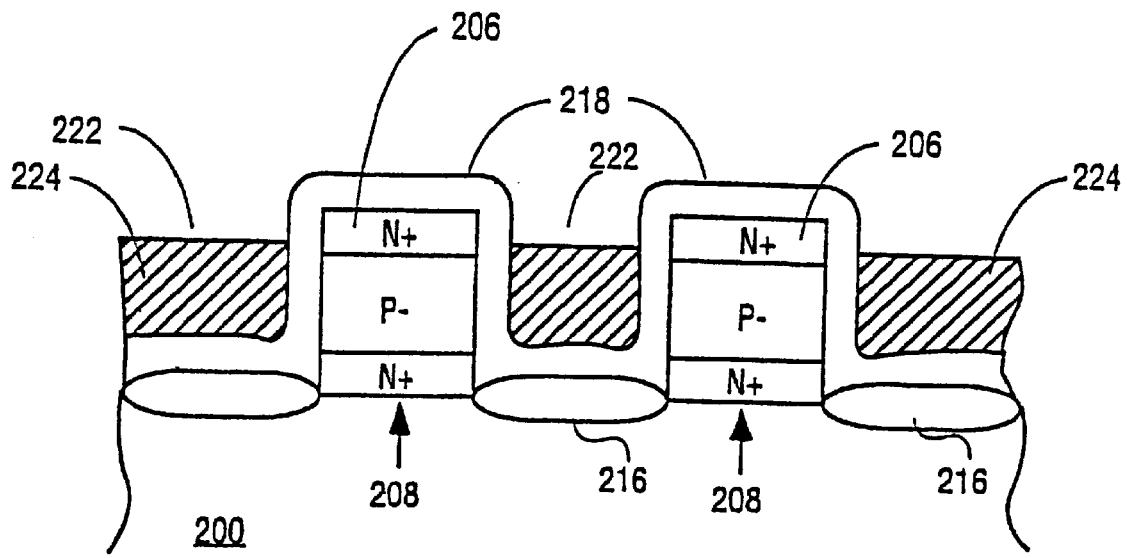

Next, as shown in FIG. 2i, a control gate material 220 is blanket deposited onto the charge storage medium 218 over and around strips 208. The control gate material is formed to a thickness at least sufficient to completely fill the gaps between adjacent strips. Typically, a conformal film deposited to a thickness of at least one-half the width of the gap while insuring complete filling of the gaps. In one embodiment of the present invention, the control gate material 220 is a blanket deposited N+ doped polysilicon film formed by chemical vapor deposition. Alternatively, the control gate can be formed from a blanket deposited tungsten film formed by chemical vapor deposition utilizing $WF_6$. Next, as shown in FIG. 2j, the control gate film 220 is planarized back, by for example, chemical mechanical polishing until the top surface of the control gate is substantially planar with the charge storage medium on top of strips 208. A plasma etch process is then utilized to recess 222 the top surface of the control gate material 220 below the top surface of strips 208 and preferably to slightly above the junction between N+ region 206 and P region 204. After the recess etch, a pair of control gates 224 have been formed along laterally opposite sidewalls 210 of strips 208. The above process forms control gates 224 adjacent to strips 208 in a self aligned manner.

Figure 2K:
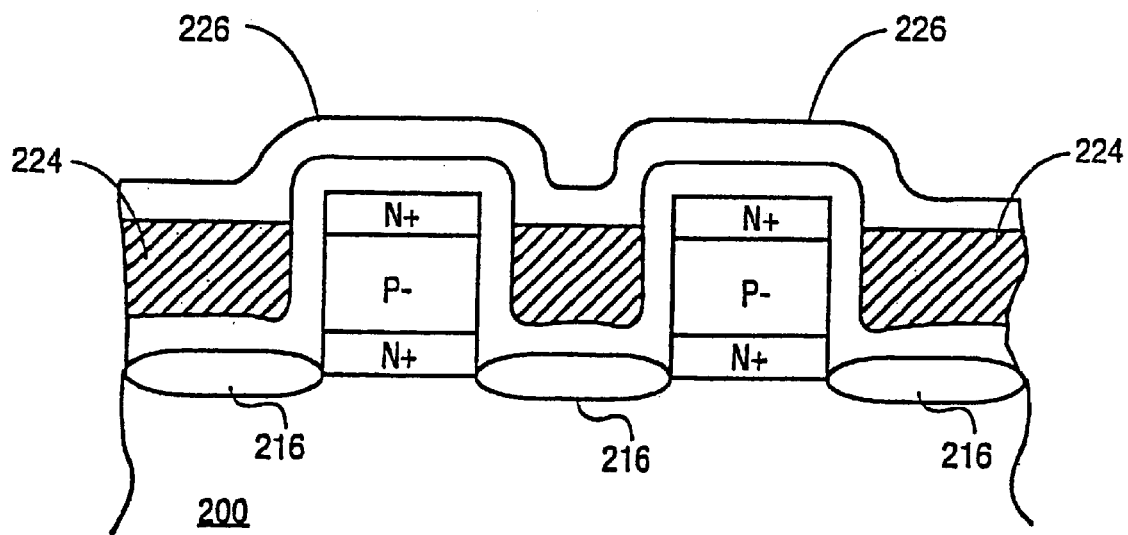
Figure 2L:
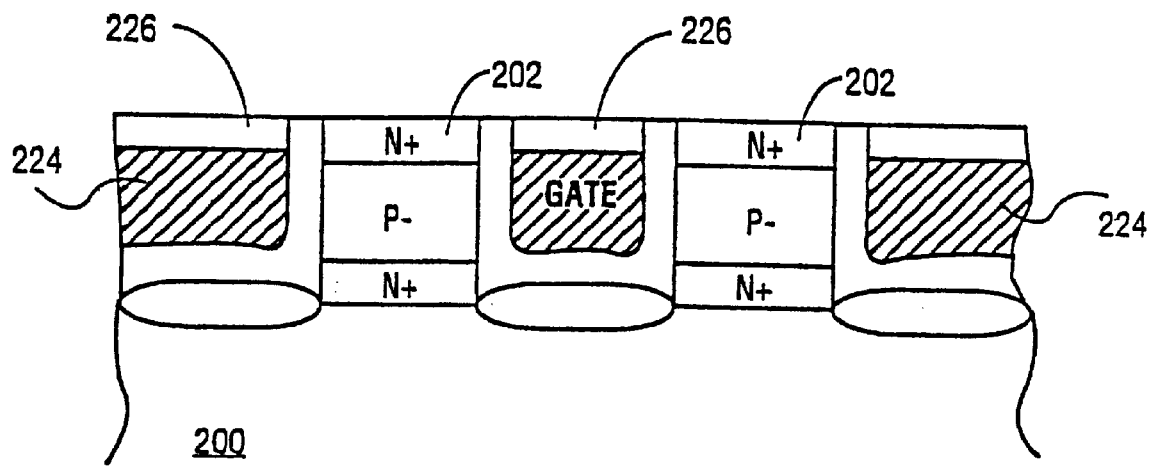

Next, as shown in FIG. 2k, an interlayer dielectric (ILD) 226, such as an oxide, is blanket deposited over the top of strips 208 and over the control gates 224 formed between adjacent strips. As shown in FIG. 2l, the deposited oxide as well as the charge storage medium on the top of strips 208 are polished or etched back with well-known techniques such as chemical mechanical polishing to reveal and open the top surface of N+ region 206. The remaining oxide 226 on the control gates 224 provides isolation of control gates 224 from subsequently formed control gates and source/drain conductors. Interlayer dielectric 226 is formed to a thickness sufficient to completely fill recess 222.

Figure 2M:
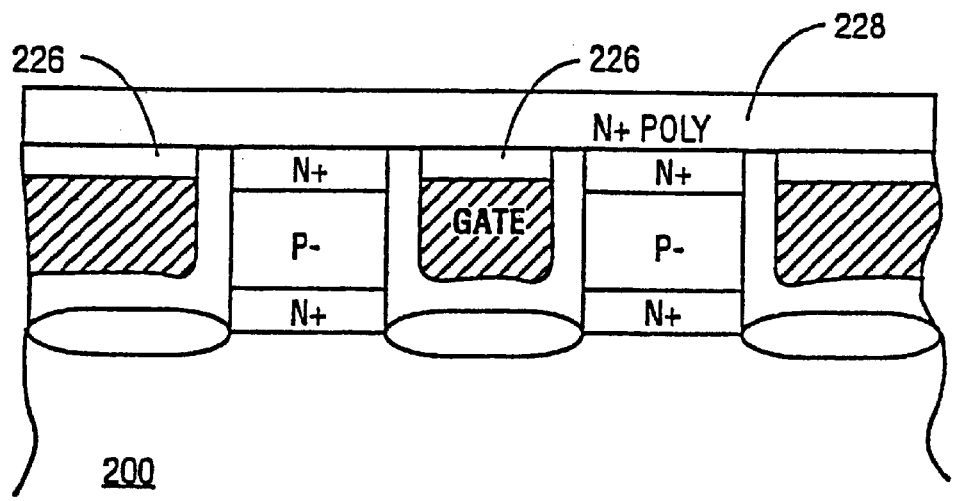

Next, a conductive layer 228 is blanket deposited onto ILD 226 and N+ region 206 of strips 208 as shown in FIG. 2m. In a preferred embodiment of the present invention the conductive film is a highly doped ($1 \times 10^{19}$ to $1 \times 10^{20}$ atoms/$cm^3$) N+ polycrystalline silicon film. A N+ polycrystalline silicon film can be formed by well-known techniques such as by chemical vapor deposition. Alternatively, conductive film 228 can be a metal conductor such as, but not limited to, tungsten or titanium silicide. A N+ polycrystalline silicon film 228 can be formed to a thickness between 1000–5000 Å.

Figure 2N:
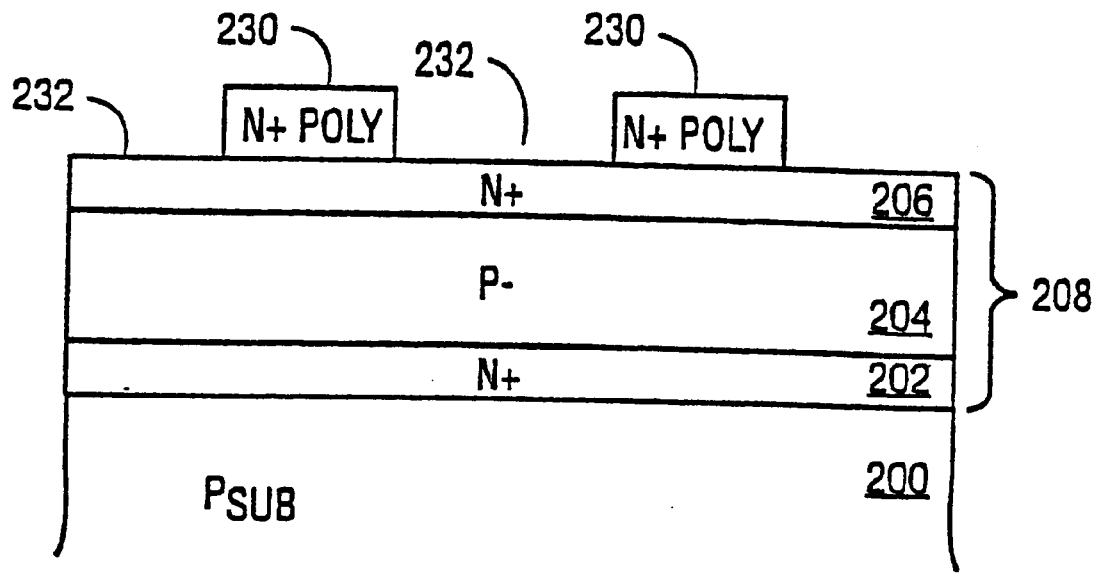
Figure 2O:
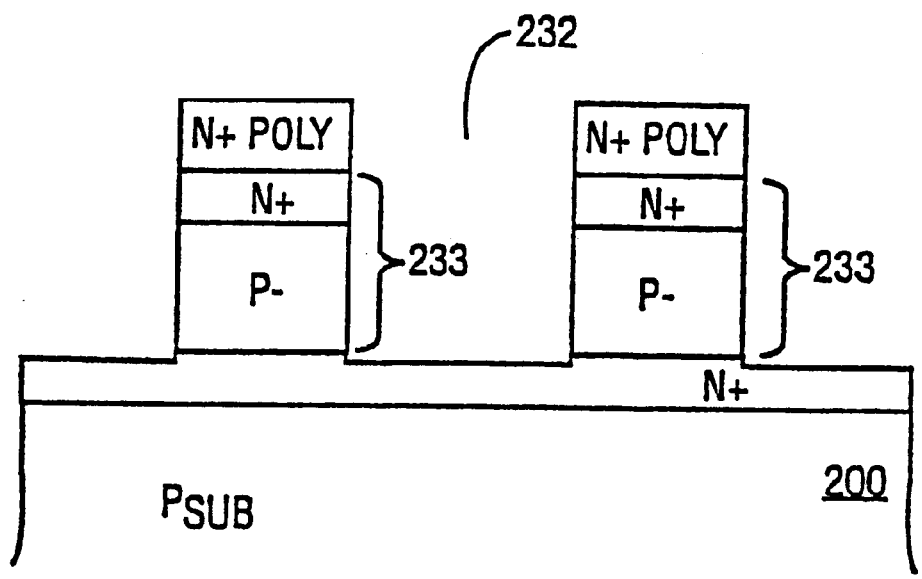

Next, as shown in FIG. 2n (substrate 200 rotated 90°), the conductive film 228 is patterned into a plurality of conductor lines 230 which run perpendicular or orthogonal to strip 208. Well-known photolithography and etching techniques can be used to pattern conductive film 228 into a plurality of parallel conductor lines 230. Next, as shown in FIG. 2o, the etch used to pattern conductor lines 230 is continued to remove the portion 232 of strip 208 not covered or masked by conductor lines 230. The etch is continued through the top N+ silicon region 206, and through the P– silicon region 204 and stops on or in the N+ region 202. In this way, as shown in FIG. 2o, square or rectangular pillars 233 are formed from the strips or lines 208 at the intersection or overlap of the lines 208 and the conductors 230. In an embodiment of the present invention, square shaped pillars having a width of less than 0.18 μm are formed. It is to be appreciated that the etch step preferably uses an etch which can selectively etch strip 208 with respect to ILD 226 and charge trapping dielectric 218. For example, silicon can be anisotropically etched utilizing a plasma etch which utilizes $CO_2$ and HBr without significantly etching in the oxide ILD 226. It is to be appreciated that ILD 226 protects and isolates the underlying control gate 224. N+ region 202 is left unetched and provides a conductor (wordline or bitline) which couples pillars 233 together in rows or columns. Similarly, conductor lines 230 provide a conductor (bitline or wordline) which couples pillars together in columns or rows.

At this time, if desired, the substrate can be subjected to successive ion implantation steps to alter the doping density of each newly revealed surface or face of P type body 204 of pillar 233 in order to alter the doping density of each newly revealed face and therefore the threshold voltage of each face.

Figure 2P:
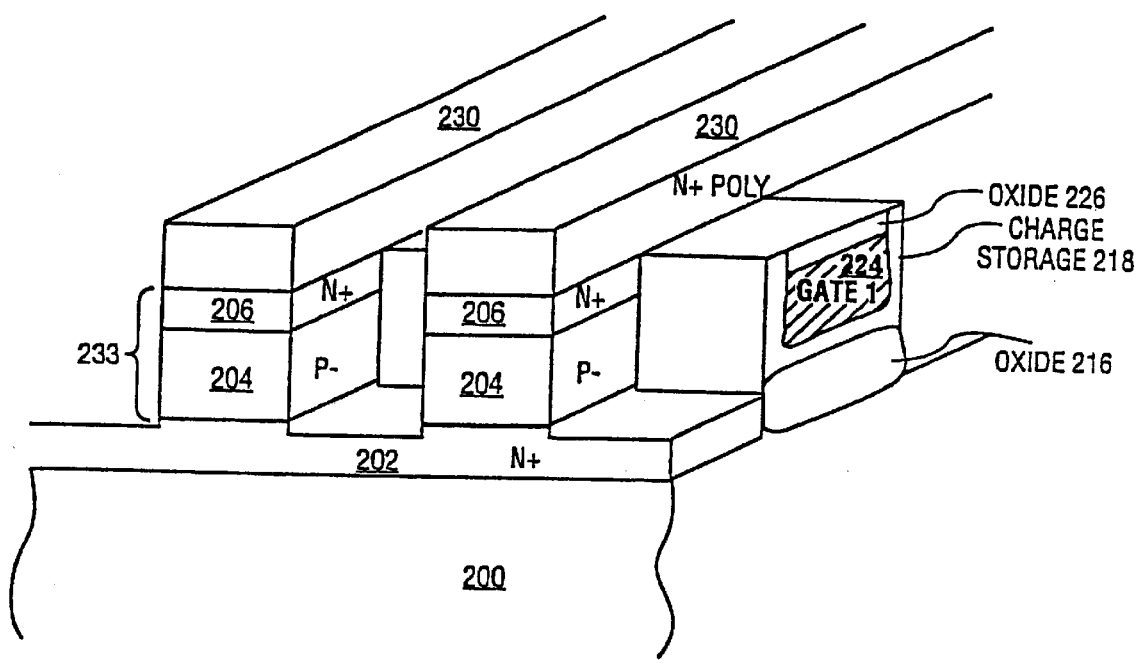
Figure 2Q:
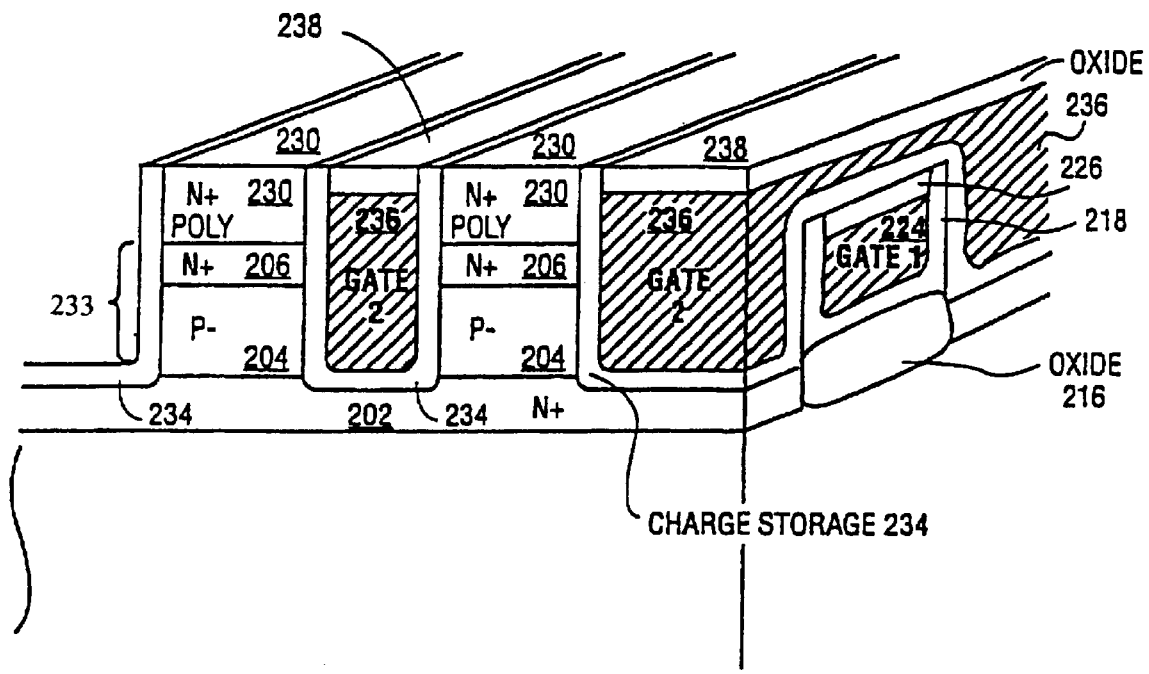

FIG. 2p is an isometric view after the etch which forms pillars 233. Next, as shown in FIG. 2q, a second charge storage medium 234 is blanket deposited over and around conductors 230 as well as pillars 233 and onto N+ region 202 and oxide dielectric 226. A second control gate material 236 is then blanket deposited over and onto second charge storage medium 234. The second control gate material is then polished back and optionally recessed as described with respect to FIG. 2j to form a second pair of control gates adjacent to laterally opposites sides of pillars 233. Additionally, and optionally a second interlayer dielectric 238 can then be blanket deposited and polished back as described with respect to FIGS. 2k and 2l to complete fabrication of the multibit nonvolatile memory device of the present invention.

Figure 2R:
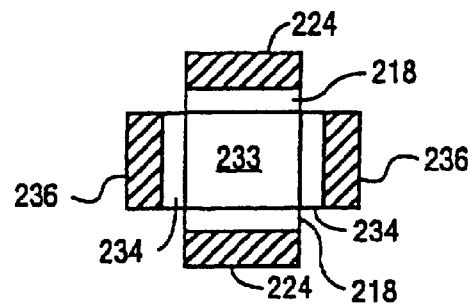

As shown in FIG. 2r, each pillar 233 has four faces whereby two laterally opposite faces have a charge storage medium 234 and independently controllable control gates 236 while the other laterally opposite faces have a charge storage medium 218 and independently controllable control gates 224.

At this time, the multibit nonvolatile pillar memory device of the present invention is complete. If desired, additional levels of multibit nonvolatile memory devices can be fabricated with the technique described above. In order to add additional levels of memory devices, one can use an overgrowth process to form a new layer of single crystalline silicon over the N+ polysilicon conductor 230 and ILD 238 in order to enable fabrication of the next level of memory devices. For example, one can use a laser anneal process to convert the top surface of the N+ polysilicon conductor 230 into single crystalline silicon and then to use the single crystalline silicon as a source from which to grow single crystal silicon over ILD 238. Alternatively, conductor 230 can be formed of material such as cobalt silicide or titanium silicide which closely matches the lattice structure of single crystalline silicon and therefore can be used as a source for the over growth of single crystal silicon over ILD 238.

It is to be appreciated that the fabrication of the multibit nonvolatile memory of the present invention has been described with respect to a specific preferred process. One of ordinary skill in the art will appreciate that other methods maybe utilized to fabricate the multibit nonvolatile memory of the present invention without departing from the scope of the present invention.

In an alternative embodiment of the present invention a multigate transistor having a vertical channel current is fabricated. That is, although the present invention has been described with respect to the formation of a nonvolatile memory device having a pillar with multiple faces and multiple charge storage mediums and multiple independently controlled gates, the same concepts and fabrication techniques can be used to fabricate NMOS or PMOS transistors having multiple gate electrodes and vertical channel currents. The structure and process of fabrication of a multigate MOS transistor with vertical channel current is the same as memory device 100 as shown in FIGS. 1a–1c except that instead of forming a charge storage medium 114–117 adjacent to each face 110–113, a gate dielectric is instead formed between each face 110–113 of pillar 102 and control gates 118–121 which are the gates of the transistor. Any well-known and suitable gate dielectric can be used such as but not limited silicon dioxide and silicon oxynitride. The gate dielectric will typically have a thickness between 10–50 Å. The fabricated MOS transistor having multiple gates and vertical read currents has a first source/drain region, a body or channel region, and a second source/drain region each substantially vertically aligned with one another. Each independently controlled gate would then prevent or allow a channel current to flow in its associated face of the pillar. When a channel current flows between the first and second source/drain region through a face of pillar 102, the channel current flows in a direction perpendicular (z) to the plane (x-y) of the single crystalline substrate on or in which the device is formed. Such a device can be used to form any type of logic device such as a microprocessor or a programmable logic array (PLA). The use of multiple gates surrounding a vertical structure enables high density integration of MOS devices. Additionally, because multiple gates are formed around a pillar having single source and a single drain region, the MOS device is ideally suited for dynamic or "domino" logic schemes.

Thus, a novel multigate semiconductor device with vertical channel current and its method of fabrication has been described.

We claim:

1. A method of forming a multibit nonvolatile memory comprising:

forming a plurality of parallel lines, each line comprising a first heavily doped semiconductor region of a first conductivity type, a second lightly doped semiconductor region of a second conductivity type on the first region and a third heavily doped semiconductor region of the first conductivity type on the second region, each of said plurality of parallel lines having a top surface comprising a top surface of a respective third heavily doped semiconductor region, a bottom and first and second laterally opposite sidewalls;

forming a first pair of charge storage media adjacent to and in contact with said first and second laterally opposite sidewalls of said plurality of parallel lines;

forming a first pair of control gates adjacent to said first pair of charge storage media adjacent to said first and second laterally opposite sidewalls;

depositing conductor film over and in contact with said top surface of said plurality of parallel lines;

etching said conductor film into a plurality of source/drain conductor lines which are perpendicular to said plurality of parallel lines, and etching a portion of said plurality of parallel lines not covered by said conductor lines to form a plurality of pillars, said pillars having third and fourth laterally opposite sidewalls;

forming a second pair of charge storage media adjacent to and in contact with said third and fourth laterally opposite sidewalls of said pillars; and forming a second pair of control gates adjacent to and in contact with said second pair of charge storage media.

2. The method of claim 1, further comprising performing a first angled threshold voltage adjustment implant into first sidewalls and a second angled threshold voltage adjustment implant into opposite second sidewalls of the plurality of parallel lines prior to forming the first pair of charge storage media.

3. The method of claim 2, further comprising performing a third angled threshold voltage adjustment implant into third sidewalls and a fourth angled threshold voltage adjustment implant into opposite fourth sidewalls of the plurality of pillars prior to forming the second pair of charge storage media.

4. The method of claim 1, wherein each of the plurality of parallel lines comprises the first heavily doped semiconductor region of the first conductivity type which comprises a source/drain region, contacting a substrate, the second lightly doped semiconductor region of the second conductivity type which comprises a channel region located on the first region and the third heavily doped semiconductor region of the first conductivity type which comprises a source/drain region, located on the second region.

5. The method of claim 4, further comprising:
    forming a first oxidation resistant film on the third heavily doped semiconductor region of the first conductivity type in the plurality of parallel lines;
    forming a second oxidation resistant film on the first and the second sidewalls of the plurality of parallel lines;
    selectively oxidizing an exposed portion of the substrate located between the plurality of parallel lines;
    removing the first and the second oxidation resistant films; and
    forming the first pair of charge storage media and the first pair of control gates over the selectively oxidized portion of the substrate.

6. The method of claim 5, further comprising:
    forming the conductor film in contact with the third heavily doped semiconductor region of the first conductivity type in the plurality of parallel lines;
    patterning the conductor film during a first patterning step to form the plurality of source/drain conductor lines; and
    patterning the plurality of parallel lines to form the plurality of pillars during the first patterning step.

7. The method of claim 6, further comprising forming an insulating layer over the first pair of control gates, wherein the insulating layer is located between the first pair of control gates and the conductor film.

8. The method of claim 1, wherein:
    forming the second pair of charge storage media comprises forming the second pair of charge storage media on exposed portions of a substrate between the plurality of pillars; and
    forming the second pair of control gates comprises forming the second pair of control gates on the second pair of charge storage media located between the plurality of pillars.

9. The method of claim 1, wherein said first and second pairs of charge storage media are an oxide with H+ ions therein, an oxide-nitride-oxide composite film, a medium which comprises nanocrystals or a floating gate.

10. The method of claim 1, wherein the plurality of source/drain conductor lines comprise heavily doped polysilicon lines of the first conductivity type.

11. The method of claim 1, wherein the source/drain conductor lines comprise metal or metal silicide lines.

12. The method of claim 1, wherein said first and second pairs of charge storage media comprise oxide-nitride-oxide composite films.

13. The method of claim 1, wherein said first and second pairs of charge storage media comprise floating gates.

14. The method of claim 1, wherein the step of forming the second pair of control gates comprises:
    depositing a second control gate material over the plurality of source/drain conductor lines and between the pillars;
    polishing back the second control gate material; and
    recessing the second control gate material below the plurality of source/drain conductor lines to form the second pair of control gates.

15. The method of claim 1, further comprising:
    forming an interlayer dielectric above the second pair of control gates; and
    polishing the interlayer dielectric such that it is located planar with the plurality of source/drain conductor lines.

16. A method of forming a multibit nonvolatile memory comprising:
    forming a first plurality of parallel lines having a top surface and bottom surface, wherein:
        each of the first plurality of parallel lines comprises a first heavily doped semiconductor region of a first conductivity type in a monocrystalline silicon substrate, a second lightly doped semiconductor region of a second conductivity type on the first region and a third heavily doped semiconductor region of the first conductivity type on the second region;
        the top surface comprises a top surface of the respective third heavily doped semiconductor region; and
        the bottom surface is the first heavily doped region formed in the monocrystalline silicon substrate;
    forming a first insulating layer on said monocrystalline silicon substrate between said first plurality of parallel lines;
    depositing a first charge storage medium between said first plurality of parallel lines;
    depositing a first control gate film onto said first charge storage medium over and between said first plurality of parallel lines;
    etching back said first control gate film between said first plurality of parallel lines to a level beneath the top surface of said plurality of lines;
    forming a second insulating layer on said etched back first control gate film between said first plurality of lines;
    blanket depositing a polysilicon film over and in contact with said top surface of said first plurality of parallel lines and on said second insulating layer between said first plurality of parallel lines;
    etching said polysilicon film into a second plurality of lines which are perpendicular to said first plurality of parallel lines, and etching a portion of said first plurality of parallel lines not covered by said second plurality of lines to form a plurality of pillars at the intersections of said first and second plurality of lines;
    depositing a second charge storage medium between said second plurality of lines and between said pillars; and
    depositing a second control gate material on said second charge storage medium between said second plurality of lines and between said pillars.

17. The method of claim 16, further comprising performing a first angled threshold voltage adjustment implant into first sidewalls and a second angled threshold voltage adjustment implant into opposite second sidewalls of the first plurality of parallel lines prior to depositing the first charge storage medium.

18. The method of claim 17, further comprising performing a third angled threshold voltage adjustment implant into third sidewalls and a fourth angled threshold voltage adjustment implant into opposite fourth sidewalls of the plurality of pillars prior to depositing the second charge storage medium.

19. The method of claim 16, further comprising:
   forming a first oxidation resistant film on the third heavily doped semiconductor region of the first conductivity type in the first plurality of parallel lines;
   forming a second oxidation resistant film on sidewalls of the first plurality of parallel lines;
   selectively oxidizing an exposed portion of the monocrystalline silicon substrate located between the first plurality of parallel lines to form the first insulating layer; and
   removing the first and the second oxidation resistant films.

20. The method of claim 19, wherein depositing the second charge storage medium comprises depositing the second charge storage medium on exposed portions of the substrate between the plurality of pillars.

21. The method of claim 16, wherein said first and the second charge storage medium is an oxide with H+ ions therein, an oxide-nitride-oxide composite film, a medium which comprises nanocrystals or a floating gate.

22. The method of claim 16, wherein:
   the second plurality of lines comprise source/drain conductors which contact the third heavily doped semiconductor regions in the plurality of pillars; and
   the third heavily doped semiconductor regions comprise source or drain regions.

23. A method of fabrication a nonvolatile multibit memory comprising:
   forming a first N+ doped region in a P type silicon substrate;
   growing a P-type silicon film on said first N+ doped region;
   implanting N type impurities into said P-type silicon film to form a second N+ doped region on said P-type silicon film;
   patterning said first N+ doped region, said P-type silicon film, and said second N+ doped region into a first plurality of parallel lines;
   forming a nitride film on the sidewalls of said first plurality of parallel lines;
   oxidizing said substrate to grow an oxide between said first plurality of parallel lines;
   depositing a first charge storage medium over and around and between said first plurality of parallel lines;
   depositing a first control gate material on said first charge storage medium over and around and between said first plurality of parallel lines;
   removing said control gate material between said first plurality of parallel lines to below a top surface of said second N+ doped region;
   blanket depositing an insulating oxide on said control gate material between said first plurality of parallel lines and on said first charge storage medium on said first plurality of parallel lines;
   removing said insulating oxide and said first charge storage medium from the top of said first plurality of parallel lines to expose said second N+ doped region;
   depositing an N+ polysilicon film over and onto said second N+ doped region and over and onto said insulating oxide on said control gate material between said first plurality of parallel lines;
   patterning said N+ polysilicon film into a second plurality of parallel lines wherein said second plurality of parallel lines run orthogonal to said first plurality of parallel lines;
   continuing the patterning of said N+ polysilicon film through said second N+ doped region, said P-type silicon film, and stopping on said first N+ doped region and thereby forming a plurality of N+/P−/N+ pillars at the intersections of said first and second plurality of lines;
   depositing a second charge storage medium over and around said plurality of pillars;
   blanket depositing a second control gate film over said second charge storage medium; and
   etching back said second control gate film.

24. The method of claim 23, further comprising:
   performing a first angled threshold voltage adjustment implant into first sidewalls and a second angled threshold voltage adjustment implant into opposite second sidewalls of the first plurality of parallel lines prior to forming the first charge storage medium; and
   performing a third angled threshold voltage adjustment implant into third sidewalls and a fourth angled threshold voltage adjustment implant into opposite fourth sidewalls of the plurality of pillars prior to forming the second charge storage medium.

25. The method of claim 23, wherein the first and the second charge storage medium is an oxide with H+ ions therein, an oxide-nitride-oxide composite film, a medium which comprises nanocrystals or a floating gate.

26. A method of forming a multibit nonvolatile memory comprising:
   forming a first plurality of parallel lines having a top surface and bottom surface, wherein:
      the first plurality of parallel lines comprise a first heavily doped semiconductor region of a first conductivity type in a monocrystalline silicon substrate, a second lightly doped semiconductor region of a second conductivity type on the first region and a third heavily doped semiconductor region of the first conductivity type on the second region;
      the top surface comprises a top surface of the third heavily doped semiconductor region; and
      the bottom surface is the first heavily doped region formed in the monocrystalline silicon substrate;
   forming a first oxidation resistant film on the third heavily doped semiconductor region of the first conductivity type in the first plurality of parallel lines;
   forming a second oxidation resistant film on sidewalls of the first plurality of parallel lines;
   selectively oxidizing an exposed portion of the monocrystalline silicon substrate located between the first plurality of parallel lines to form a first insulating layer on said monocrystalline silicon substrate between said first plurality of parallel lines;
   removing the first and the second oxidation resistant films;

depositing a first charge storage medium between said first plurality of parallel lines;

depositing a first control gate film onto said first charge storage medium over and between said first plurality of parallel lines;

etching back said first control gate film between said first plurality of parallel lines to a level beneath the top surface of said first plurality of parallel lines;

forming a second insulating layer on said etched back first control gate film between said first plurality of parallel lines;

blanket depositing a polysilicon film over and in contact with said top surface of said first plurality of parallel lines and on said second insulating layer between said first plurality of parallel lines;

etching said polysilicon film into a second plurality of lines which are perpendicular to said first plurality of parallel lines, and etching a portion of said first plurality of parallel lines not covered by said second plurality of lines to form a plurality of pillars at the intersections of said first and second plurality of lines;

depositing a second charge storage medium between said second plurality of lines and on exposed portions of the substrate between the plurality of pillars;

depositing a second control gate material on said second charge storage medium between said second plurality of lines and between said pillars;

polishing back the second control gate material;

recessing the second control gate material below the second plurality of lines to form second control gates;

forming an interlayer dielectric above the second control gates; and polishing the interlayer dielectric such that it is located planar with the second plurality of lines.

27. A method of forming a multibit nonvolatile memory comprising:

forming a plurality of parallel lines, each line comprising a first heavily doped semiconductor region of a first conductivity type, a second lightly doped semiconductor region of a second conductivity type on the first region and a third heavily doped semiconductor region of the first conductivity type on the second region, each of said plurality of parallel lines having a top surface, a bottom and first and second laterally opposite sidewalls;

forming a first pair of charge storage media adjacent to and in contact with said laterally opposite sidewalls of said plurality of parallel lines;

forming a first pair of control gates adjacent to said first pair of charge storage media adjacent to said first and second laterally opposite sidewalls;

patterning said plurality of parallel lines into a plurality of pillars, said pillars having first and second laterally opposite sidewalls;

forming a second pair of charge storage media adjacent to and in contact with said laterally opposite sidewalls of said pillars and on exposed portions of a substrate between the plurality of pillars; and forming a second pair of control gates adjacent to and in contact with said second pair of charge storage media and on the second pair of charge storage media located on exposed portions of the substrate between the plurality of pillars.

28. The method of claim 27, wherein the second pair of charge storage media comprise an oxide with H+ ions therein, an oxide-nitride-oxide composite film or a medium which comprises nanocrystals.

* * * * *